United States Patent [19]

Nishi

[11] Patent Number: 5,473,410
[45] Date of Patent: Dec. 5, 1995

[54] PROJECTION EXPOSURE APPARATUS

[75] Inventor: Kenji Nishi, Kawasaki, Japan

[73] Assignee: Nikon Corporation, Tokyo, Japan

[21] Appl. No.: 254,672

[22] Filed: Jun. 6, 1994

Related U.S. Application Data

[63] Continuation of Ser. No. 68,101, May 28, 1993, abandoned.

[30] Foreign Application Priority Data

Nov. 28, 1990 [JP] Japan .................................. 2-328221

[51] Int. Cl.⁶ .................................................. G03B 27/42
[52] U.S. Cl. .............................. 355/53; 355/67; 355/74
[58] Field of Search .................................. 355/53, 67, 74

[56] References Cited

U.S. PATENT DOCUMENTS

| | | | |
|---|---|---|---|
| 4,747,678 | 5/1988 | Shafer et al. | 350/505 |
| 4,924,257 | 5/1990 | Jain | 355/53 |
| 5,105,075 | 4/1992 | Ohta et al. | 355/53 |

FOREIGN PATENT DOCUMENTS 2-229423  9/1990  Japan .

OTHER PUBLICATIONS

Optical/Laser Microlithography II, Jere D. Buckley et al, SPIE vol. 1088 (1989), pp. 424–433.

Primary Examiner—Monroe H. Hayes
Attorney, Agent, or Firm—Shapiro and Shapiro

[57] ABSTRACT

Disclosed is a projection exposure apparatus by a scan-exposure method. The apparatus includes an illuminating means for illuminating a mask transfer region with illumination light for an exposure through an aperture of a variable field stop disposed in a position substantially conjugate to the mask; a driving means for configuring the aperture of the variable field stop in a rectangular shape (having edges orthogonal to a direction of the scan-exposure) and simultaneously making variable a width of the rectangular aperture of the stop in a widthwise direction (the scan-exposure direction) of the transfer region (pattern forming region) on the mask; and a control means for controlling the driving means to change a width of the rectangular aperture of the variable field stop in interlock with variations in position of the variable field stop on the mask transfer region which varies due to the one-dimensional movements of the mask stage.

19 Claims, 9 Drawing Sheets

PROJECTION EXPOSURE APPARATUS

This is a continuation of application Ser. No. 08/068,101 filed May 28, 1993, now abandoned.

BACKGROUND OF THE INVENTION

1. Field of the Invention

The present invention relates to a projection exposure apparatus for use in a lithography step in the course of manufacturing a semiconductor element, a liquid crystal display element, etc.

2. Related Background Art

This kind of projection exposure apparatus has hitherto been classified roughly into two types. One of them may involve the use of a method of exposing a photosensitive substrate such as a wafer, a plate, etc. by a step-and-repeat method through a projection optical system having an exposure field capable of including a whole pattern of a mask (reticle). The other type may involve the use of a scan method of effecting the exposure with a relative scan performed under mask illumination of arched slit illumination light, wherein the mask and the photosensitive substrate are disposed in a face-to-face relationship with the projection optical system interposed therebetween.

A stepper adopting the former step-and-repeat exposure method is a dominant apparatus in the recent lithography process. The stepper exhibits a resolving power, an overlap accuracy and a throughput which are all higher than in an aligner adopting the latter scan exposure method. It is considered that the stepper will continue to be dominant for some period from now on into the future.

By the way, a new scan exposure method for attaining a high resolving power has recently been proposed as a step-and-scan method on pp.424–433 of Optical/Laser Microlithography II (1989), SPIE Vol.1088. The step-and-scan method is a combined version of the scan method of one-dimensionally scanning the wafer at a speed synchronizing therewith while one-dimensionally scanning the mask (reticle) and a method of moving the wafer stepwise in a direction orthogonal to a scan-exposure direction.

Figure 1:
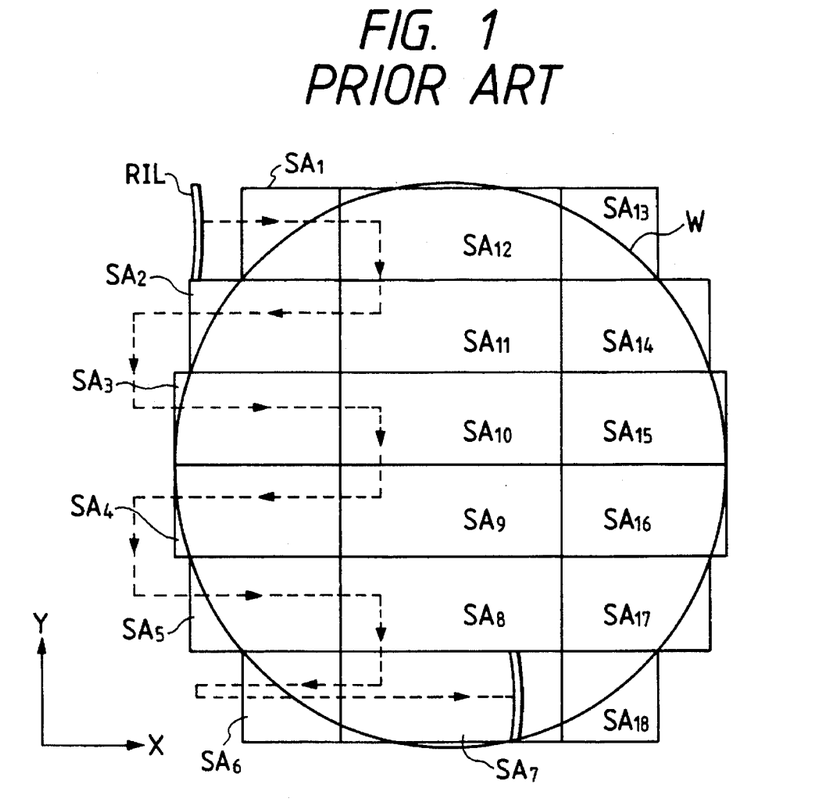
FIG. 1 is an explanatory view showing a concept of a conventional step & scan exposure method using a beam of arched slit illumination light.

FIG. 1 is an explanatory view showing a concept of the step & scan method. Herein, shot regions (one chip or multi-chips) arranged in an X-direction on a wafer W are scan-exposed by beams of arched slit illumination light RIL. The wafer W is stepped in a Y-direction. Referring to the same Figure, arrows indicated by broken lines represent a route of the step & scan (hereinafter abbreviated to S & S) exposure. The shot regions undergo the same S & S exposure in the sequence such as $SA_1$, $SA_2$, ... $SA_6$. Subsequently, the same S & S exposure is performed on the shot regions in the sequence such as $SA_7$, $SA_8$, ... $SA_{12}$ arranged in the Y-direction at the center of the wafer W. In the aligner based on the S & S method disclosed in the above-mentioned literature, an image of the reticle pattern illuminated with the arched slit illumination light RIL is formed on the wafer W via a ¼ reduction projection optical system. Hence, an X-directional scan velocity of the reticle stage is accurately controlled to a value that is four times the X-directional scan velocity of the wafer stage. Further, the reason why the arched slit illumination light RIL is employed is to obtain such advantages that a variety of aberrations become substantially zero in a narrow (zonal) range of an image height point spaced a given distance apart from the optical axis by using a reduction system consisting of a combination of a refractive element and a reflex element as a projection optical system. One example of such a reflex reduction projection system is disclosed in, e.g., U.S. Pat. No. 4,747,678.

Proposed in, e.g., Japanese Patent Laid-open Application No. 2-229423 (U.S. Pat. No. 4,924,257) is an attempt to apply a typical projection optical system (full field type) having a circular image field to an S & S exposure method other than the above-described S & S exposure method which uses the arched slit illumination light. The following are particulars disclosed in this Patent Laid-open Application. Exposure light with which the reticle (mask) is illuminated takes a regular hexagon inscribed to a circular image field of a projection lens system. Two face-to-face edges of the regular hexagon extend in a direction orthogonal to the scan-exposure direction. It is thus attain the S & S exposure exhibiting a more improved throughput. That is, this Patent Laid-open Application shows that the scan velocities of the reticle stage and of the wafer stage can be set much higher than by the S & S exposure method using the arched slit illumination light by taking an as large reticle (mask) illumination region in the scan-exposure direction as possible.

According to the above-described prior art disclosed in Japanese Patent Laid-open Application No. 2-229423, the mask illumination region is enlarged in the scan-exposure direction to the greatest possible degree. This is therefore advantageous in terms of the throughput.

By the way, there is nothing but to take the zig-zag S & S method shown in FIG. 1 even in the apparatus disclosed in the above-mentioned Patent Laid-open Application in consideration of actual scan sequences of mask stage and the wafer stage.

The reason for this is Given as follows. A diameter of the wafer W is set to 150 mm (6 inch). When trying to complete the exposure of one-row shot regions corresponding to the wafer diameter by only one continuous X-directional scan, the premise is that a ⅕ projection lens system is employed. Based on this premise, a scan-directional (X-directional) length is as long as 750 mm (30 inch). It is extremely difficult to manufacture this kind of reticle. Even if such a reticle can be manufactured, a stroke of the reticle stage for scanning the reticle in the X-direction requires 750 mm or more. Therefore, the apparatus invariably highly increases in size. For this reason, there is no alternative but to perform the zig-zag scan even in the apparatus disclosed in the above-mentioned Patent Laid-open Application.

It is therefore required that the periphery of the pattern region on the reticle be widely covered with a light shielding substance so as not to transfer the reticle pattern within an adjacent shot region with respect to, e.g., the shot regions $SA_1$, $SA_{12}$ shown in FIG. 1.

Figure 2A:
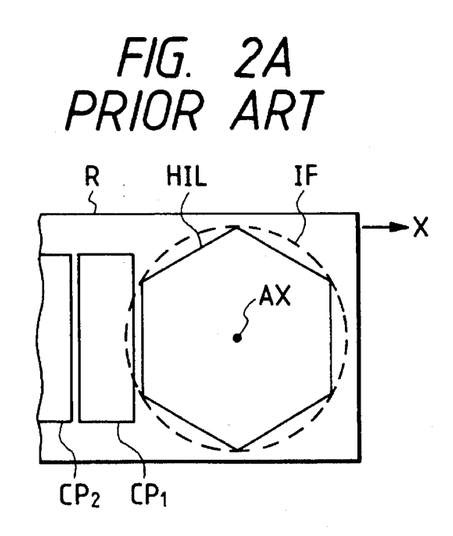
FIGS. 2A and 2B are explanatory views showing a conventional scan-exposure method employing a beam of regular hexagonal illumination light.
Figure 2B:
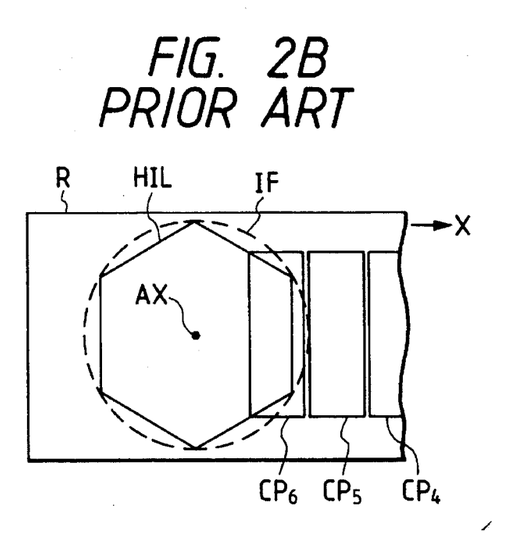

FIGS. 2A and 2B each illustrate a layout of a hexagonal illumination region HIL, a circular image field IF of the projection lens system and a reticle R during a scan exposure. FIG. 2A shows a state where the hexagonal illumination region HIL is set in a start-of-scan position on the reticle R. Only the reticle R one-dimensionally moves rightward in the same Figure from this state. FIG. 2B illustrates a state at the end of one scanning process.

Referring to FIGS. 2A and 2B, the symbols $CP_1$, $CP_2$, ... $CP_6$ represent chip patterns formed in row in the X-direction on the reticle R. A row of these six chip patterns correspond to the shot regions to be exposed by one scanning process in the X-direction. Note that in the same Figures, the central point of the hexagonal illumination region HIL coincides substantially with the center of the image field, i.e., an optical axis AX of the projection lens system.

As obvious from FIGS. 2A and 2B, the light shielding substance equal to or larger than at least a scan-directional width dimension of the hexagonal illumination region HIL is needed for the exterior of the pattern region in the start- and end-of-scan areas on the reticle R. Simultaneously, a scan-directional dimension of the reticle R itself also increases. An X-directional moving stroke of the reticle stage is also needed corresponding to a total of an X-directional dimension of the entire patterns $CP_1$–$CP_6$ and a scan-directional dimension of the hexagonal illumination region HIL. Those are thinkable problems in terms of shaping up an apparatus.

SUMMARY OF THE INVENTION

It is a primary object of the present invention, which has been devised in view of the foregoing problems, to provide a projection exposure apparatus by a scan method (or an S & S method) exhibiting an increased throughput by minimizing a moving stroke of a reticle stage during a scan-exposure without providing a specially wide light shielding substance along the periphery of a pattern exposure region on a reticle (mask).

To accomplish this object, according to one aspect of the present invention, there is provided a projection exposure apparatus by a scan-exposure method, including an illuminating means for illuminating a mask transfer region with illumination light for an exposure through an aperture of a variable field stop disposed in a position substantially conjugate to the mask. This apparatus also includes a driving means for configuring the aperture of the variable field stop in a rectangular shape (having edges orthogonal to a direction of the scan-exposure) and simultaneously making variable a width of the rectangular aperture of the stop in a widthwise direction (the scan-exposure direction) of the transfer region (pattern forming region) on the mask.

The projection exposure apparatus further includes a control means for controlling the driving means to change a width of the rectangular aperture of the variable field stop in interlock with variations in position of the variable field stop on the mask transfer region which varies due to the one-dimensional movements of the mask stage.

Based on the conventional scan-exposure method, the mask is irradiated with the illumination light via an aperture in a fixed shape (hexagon, arched illumination area, etc.). According to the present invention, however, the scan-directional width of the aperture (variable field stop) is varied interlocking with a scan of the mask or the photosensitive substrate. The same S & S exposure method can be therefore realized simply by sequentially narrowing the aperture width without causing a large overrun of the mask in the start- and end-of-scan areas on the mask. Accordingly, the overrun of the mask stage is eliminated in terms of its necessity or extremely reduced, whereby the moving stroke of the mask stage can be minimized. At the same time, the width of the light shielding substance formed along the periphery of the pattern forming region on the mask may also be small to the same extent as that in the conventional mask. The advantage lies in a decrease in labor for inspecting a pin hole defect in the light shielding substance (normally, a chrome layer) during a manufacturing process of the mask.

Further, the aperture of the variable field stop is set in a shape adapted to the pattern forming region on the mask, thereby making is possible to utilize the apparatus also as a stepper equal to the conventional one.

Besides, an aperture position and a geometrical configuration of the variable field stop are set to cause variations one-dimensionally, two-dimensionally or in a rotational direction within the image field of the projection optical system. It is thus feasible to instantaneously correspond to mask patterns of a variety of chip sizes.

As explained above, according to the present invention, it is possible to minimize the moving stroke of the mask (reticle) in accordance with the scan-exposure method. A dimension of the light shielding band on the mask can also be reduced.

At the same time, the scan-directional illumination region on the mask can be taken large, and, therefore, the throughput can be remarkably enhanced in combination with a diminution in the moving stroke.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Figure 3:
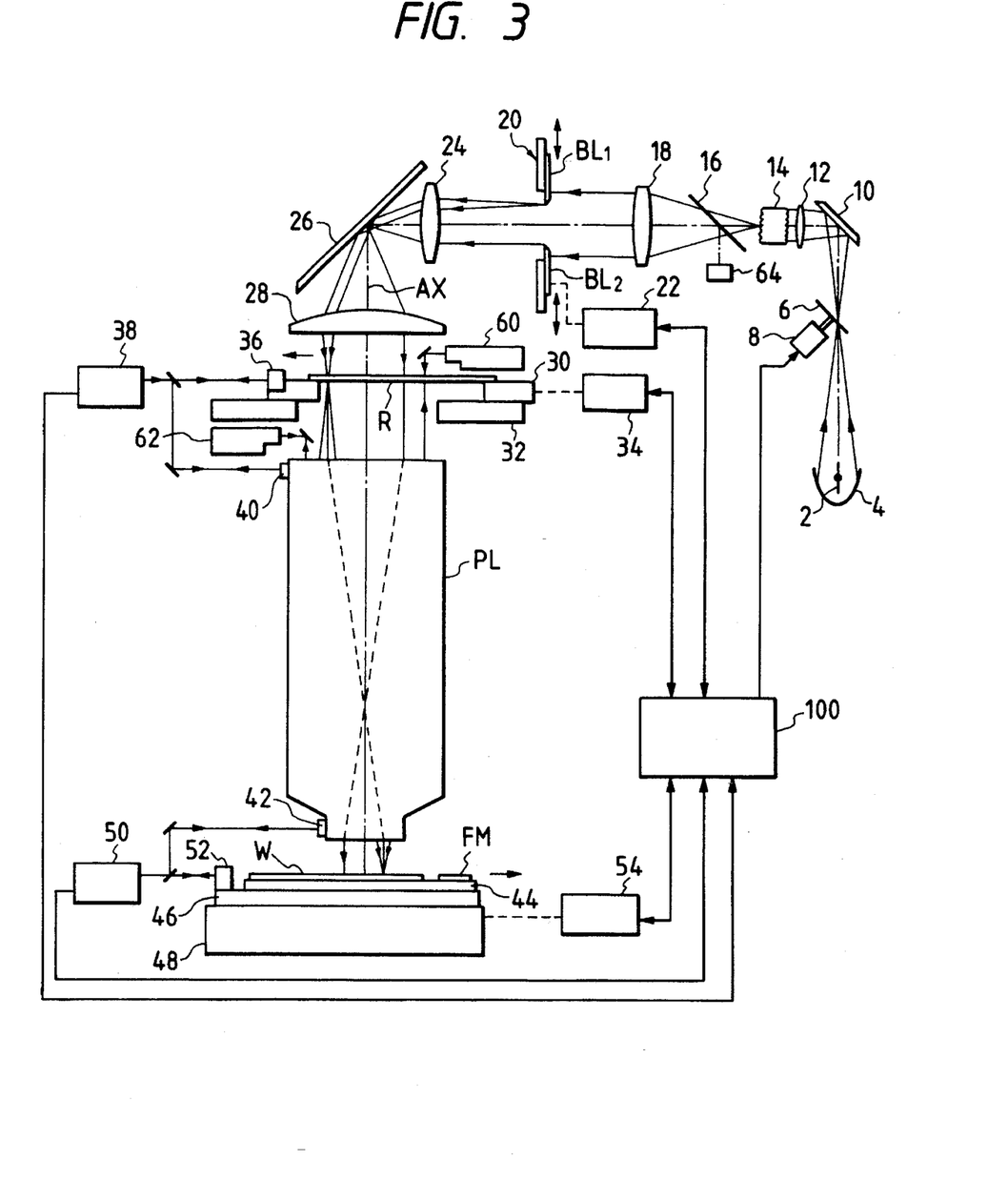
FIG. 3 is a view illustrating a construction of a projection exposure apparatus in an embodiment of this invention.

FIG. 3 illustrates a construction of a projection exposure apparatus in a first embodiment of this invention. This embodiment involves the use of a projection optical system (hereinafter simply termed a projection lens for simplicity) PL constructed of only a ⅕ reduction refractive element which is telecentric on both sides or of a combination of the refractive element and a reflex element.

Figure 4:
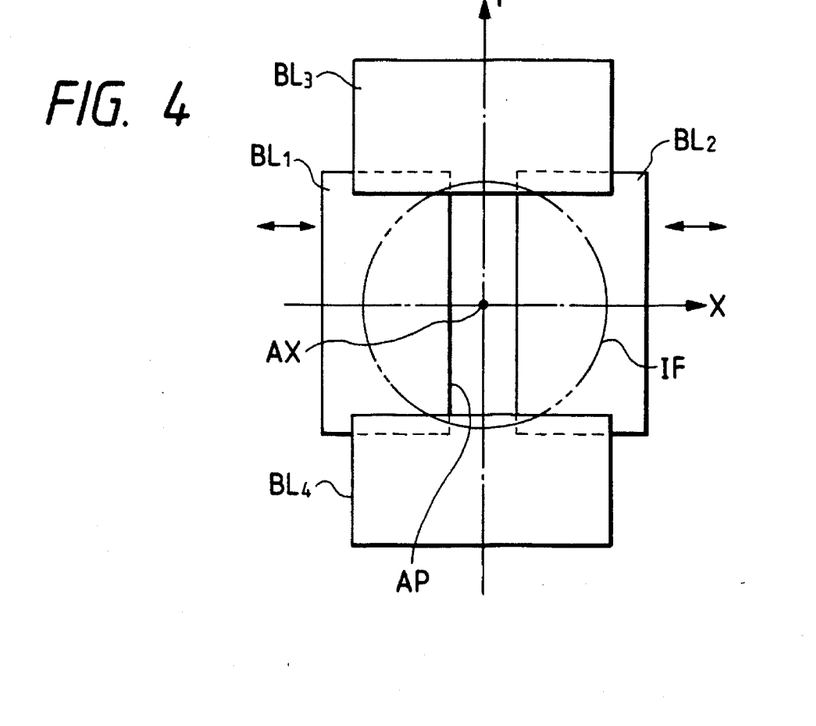
FIG. 4 is a plan view illustrating shapes of blades of a blind mechanism.

Exposure illumination light emitted from a mercury lamp 2 is condensed at a second focal point through an elliptical mirror 4. Disposed at this second focal point is a rotary shutter 6 for switching over a cut-off and a transmission of the illumination light with the aid of a motor 8. The exposure the illumination light passing through the shutter 6 is reflected by a mirror 10. The illumination light beam is then incident on a fly eye lens system 14 via an input lens 12. A multiplicity of secondary light source images are formed on the outgoing side of the fly eye lens system 14. The illumination light beam from each of the secondary light source images falls on a lens system (condenser lens) 18 via a beam splitter 16. Movable blades $BL_1$, $BL_2$, $BL_3$, $BL_4$ of a blind mechanism 20 are, as illustrated in FIG. 4, arranged on a rear focal plane of the lens system 18. Four pieces of blades $BL_1$, $BL_2$, $BL_3$, $BL_4$ are individually independently moved by a driving system 22. In accordance with this embodiment, an X-directional (scan-exposure direction) width of an aperture AP is determined by edges of the blades $BL_1$, $BL_2$. A Y-directional (stepping direction) length of the aperture AP is determined by the edges of the blades $BL_3$, $BL_4$.

Further, a shape of the aperture AP defined by the respective edges of the four blades $BL_1$–$BL_4$ is so determined as to be embraced by a circular image field IF of the projection lens PL. Now, the illumination light has a uniform distribution of illuminance in a position of the blind mechanism 20. A reticle R is irradiated with the illumination light via a lens system 24, a mirror 26 and a main condenser lens 28 after passing through the aperture AP of the blind mechanism 20. At this time, an image of the aperture AP defined by the four blades $BL_1$–$BL_4$ of the blind mechanism 20 is formed on a pattern surface of the underside of the reticle R. Note that an arbitrary image forming magnification can be Given by the lens system 24 in combination with the condenser lens 28. Herein, however, it is assumed that an approximately 2-fold enlarged image of the aperture AP of the blind mechanism 20 is projected on the reticle R. Hence, an X-directional moving velocity Vbl of the blades $BL_1$, $BL_2$ may be set to Vrs/2 in order to make a scan velocity Vrs of the reticle R during a scan exposure coincident with a moving velocity of an edge image of the blades $BL_1$, $BL_2$ of the blind mechanism 20 which is projected on the reticle R.

Now, the reticle R undergoing the illumination light defined by the aperture AP is held on a reticle stage 30 movable at an equal velocity at least in the X-direction on a column 32. The column 32 is integral with, though not illustrated, a column for fixing a lens barrel for the projection lens PL. The reticle stage 30 performs a microscopic rotational movement for a yawing correction and a one-dimensional scan movement in the X-direction with the aid of a driving system 34. A movable mirror 36 for reflecting a length measuring beam emitted from a laser interferometer 38 is fixed to one end of the reticle stage 30. An X-directional position of the reticle R and a yawing quantity are measured in real time by the laser interferometer 38. Note that a fixed mirror (reference mirror) 40 for the laser interferometer 38 is fixed to an upper edge of the lens barrel for the projection lens PL. A pattern image formed on the reticle R is reduced by a factor of 5 through the projection lens PL and formed on a wafer W. The wafer W is held together with a fiducial mark plate FM by means of a wafer holder 44 capable of making a microscopic rotation. The holder 44 is installed on a Z stage 46 capable of effecting a micromotion in the (Z-) direction of an optical axis AX of the projection lens PL. Then, the Z stage 46 is installed on an XY stage 48 moving two-dimensionally in X- and Y-directions. This XY stage 48 is driven by a driving system 54. Further, a yawing quantity and a coordinate position of the XY stage 48 are measured by a laser interferometer 50. A fixed mirror 42 for the laser interferometer 50 is fixed to a lower edge of the lens barrel for the projection lens PL. A movable mirror 52 is fixed to one edge of the Z stage 46.

In accordance with this embodiment, the projection magnification is set to ⅕. Therefore, during the scan exposure an X-directional moving velocity Vws of the XY stage 48 is ⅕ of the velocity Vrs of the reticle stage 30. Provided further in this embodiment is an alignment system 60, based on a TTR (through the reticle) method, for detecting an alignment mark (or a fiducial mark FM) on the wafer W through the projection lens PL as well as through the reticle R. Provided also is an alignment system 62, based on a TTL (through the lens) method, for detecting the alignment mark (or the fiducial mark FM) on the wafer W through the projection lens PL from a space under the reticle R. A relative alignment between the reticle R and the wafer W is conducted before a start of an S & S exposure or during the scan exposure.

Further, a photoelectric sensor 64 shown in FIG. 3, when the fiducial mark FM is formed as a luminescent type, receives the light from this luminescent mark via the projection lens PL, the reticle R, the condenser lens 28, the lens systems 24, 18 and the beam splitter 16. The photoelectric sensor 64 is employed when determining a position of the reticle R in a coordinate system of the XY stage 48 or when determining a detection central position of each of the alignment systems 60, 62. By the way, the aperture AP of the blind mechanism 20 is elongated as much as possible in the Y-direction orthogonal to the scan direction (X-direction), thereby making it possible to decrease the number of the X-directional scanning actions, or in other terms, the number of Y-directional stepping actions of the wafer W. In some cases, however, the Y-directional length of the aperture AP may be varied by the respective edges of the blades $BL_3$, $BL_4$ depending on sizes, shapes and an arrangement of chip patterns on the reticle R. An adjustment may be made so that the face-to-face edges of the blades, e.g., $BL_3$, $BL_4$ are aligned with street lines for defining a shot region on the wafer W. With this adjustment, a correspondence to a variation in the Y-directional size of the shot region can be easily obtained.

Further, if the Y-directional dimension of one shot region is not smaller than the Y-directional maximum dimension of the aperture AP, as disclosed in preceding Japanese Patent Laid-open Application No. 2-229423, it is required that an exposure quantity be brought into a seamless state by effecting an overlap exposure inwardly of the shot region. A method in this instance will be explained in greater detail.

Next, the operation of the apparatus in this embodiment will be discussed. A sequence and control thereof are managed in a generalizable manner by a main control unit 100. The basic action of the main control unit 100 lies in causing relative movements of the reticle stage 30 and the XY stage 48 keeping a predetermined velocity ratio during the scan exposure while restraining a relative positional relationship between the reticle pattern and the wafer pattern within a predetermined alignment error. These relative movements are effected based on inputting of velocity information given from tacho-generators in the driving systems 34, 54 as well as on inputting of yawing and positional information from the laser interferometers 38, 50.

Then, the main control unit 100 in this embodiment is remarkably characterized, in addition to its operation, by interlock-controlling the driving system 22 so that scan-directional edge positions of the blades $BL_1$, $BL_2$ of the blind mechanism 20 are shifted in the X-direction in synchronization with scanning of the reticle stage 30.

Note that if the illumination quantity during the scan exposure is fixed, the absolute velocities of the reticle stage 30 and of the XY stage 48 have to be increased according as the scan-directional maximum opening width of the aperture AP becomes larger. In principle, when the same exposure quantity (dose amount) is given to a resist on the wafer, and if the width of the aperture AP is doubled, the velocities of the XY stage 48 and the reticle stage 30 have to also be doubled.

Figure 5:
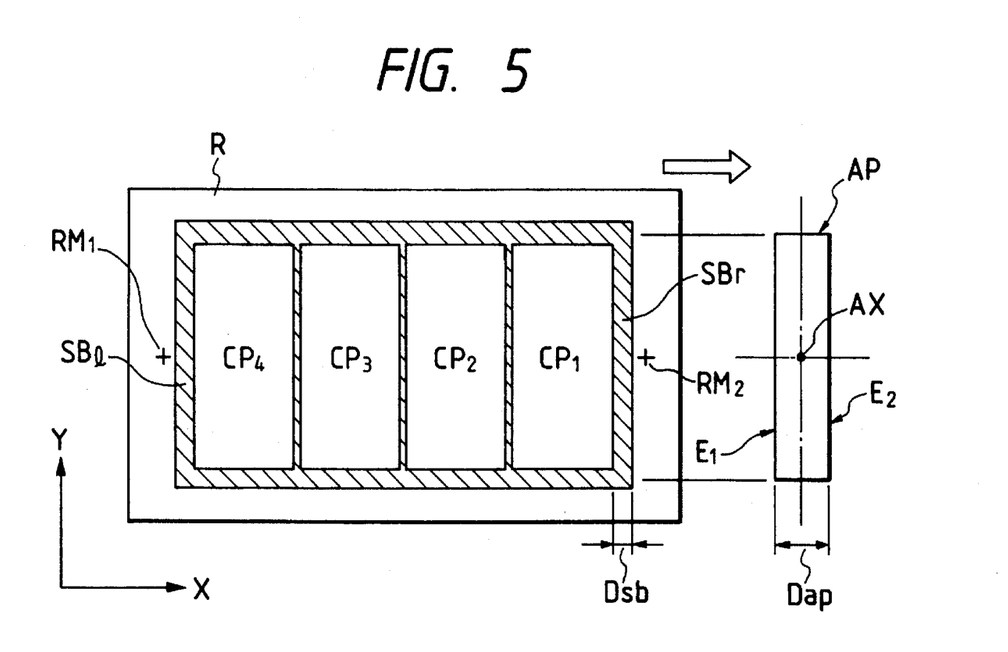
FIG. 5 is a plan view showing a pattern layout of a reticle which is suitable for the apparatus of FIG. 3.

FIG. 5 shows a relationship in layout between the reticle R mountable on the apparatus illustrated in FIG. 3 and the aperture AP of the blind mechanism 20. It is herein assumed that four pieces of chip patterns $CP_1$, $CP_2$, $CP_3$, $CP_4$ are arranged in the scan direction on the reticle R. The respective chip patterns are sectioned by light shielding bands corresponding to the street lines. A periphery of an aggregated region (shot region) of the four chip patterns is surrounded with a light shielding band having a width Dsb larger than the street line.

Let herein SBl, SBr be the right and left light shielding bands extending along the periphery of the shot region on the reticle R. It is also presumed that reticle alignment marks $RM_1$, $RM_2$ be formed externally of these light shielding bands.

The aperture AP of he blind mechanism 20 also includes edges $E_1$, $E_2$ of the blades $BL_1$, $BL_2$ which extend in parallel to the Y-direction orthogonal to the scan direction (X-direction). Let Dap be the scan-directional width of these edges $E_1$, $E_2$. Further, a Y-directional length of the aperture AP is substantially equal to a Y-directional width of the shot region on the reticle R. The blades $BL_3$, $BL_4$ are so set that the edges for defining the longitudinal direction of the aperture AP coincide with the center of the peripheral light shielding band extending in the X-direction.

The following is an explanation of how an S & S exposure is conducted in this embodiment with reference to FIGS. 6A–6E. The premise herein is such that the reticle R and the wafer W shown in FIG. 5 are relatively aligned by use of the alignment systems 60, 62 and the photoelectric sensor 64. Incidentally, FIGS. 6A–6E each sketch a profile of the reticle R shown in FIG. 5. For facilitating the understanding of motions of the blades $BL_1$, $BL_2$ of the blind mechanism 20, the blades $BL_1$, $BL_2$ are herein illustrated just above the reticle R.

Figure 6A:
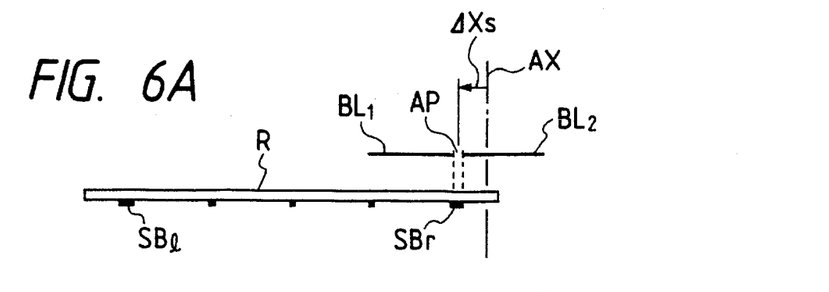
FIGS. 6A–6E are explanatory views showing scan-exposure processes in the embodiment of this invention.

To start with, as illustrated in FIG. 6A, the reticle R is set at a start-of-scan point in the X-direction. Similarly, one corresponding shot region on the wafer W is set at the start of the X-directional scan.

At this time, an image of the aperture AP through which the reticle R is illuminated has a width Dap that is ideally zero. It is, however, difficult to make the width completely zero, depending on the conditions where the edges $E_1$, $E_2$ of the blades $BL_1$, $BL_2$ are configured. Then, in accordance with this embodiment, the width Dap of the image of the aperture AP on the reticle is smaller to some extent than the width Dsb of the light shielding band SBr on the right side of the reticle R. Generally, the width Dsb of the light shielding band SBr is on the order of 4–6 mm, while the width Dap of the image of the aperture AP on the reticle may be set to about 1 mm.

Then, as shown in FIG. 6A, the X-directional center of the aperture AP is arranged to deviate by $\Delta Xs$ from the optical axis AX in a direction (left side in the same Figure) opposite to the scan advancing direction of the reticle R. This distance $\Delta Xs$ is set to approximately one-half of the maximum opening width Dap of the aperture AP with respect to this reticle R. Explaining it more specifically, the longitudinal dimension of the aperture AP is determined automatically by the Y-directional width of the shot region of the reticle R. Hence, a maximum value DAmax of the X-directional width Dap of the aperture AP is also determined by a diameter of the image field IF. The maximum value thereof is previously calculated by the main control unit 100. Further, the distance $\Delta Xs$ is determined to satisfy strictly a relationship such as DAmin+2·$\Delta Xs$=DAmax, where Dmin is the width (minimum) of the aperture AP at the start-of-scan point shown in FIG. 6A.

Figure 6B:
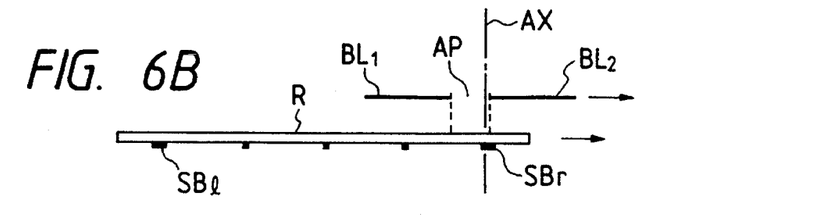

Next, the reticle stage 30 and the XY stage 48 are moved in the directions reverse to each other at a velocity ratio proportional to the projection magnification. At this time, as illustrated in FIG. 6B, only the blade $BL_2$ located in the advancing direction of the reticle R in the blind mechanism 20 is moved in synchronization with the movement of the reticle R so that an image of the edge $E_2$ of the blade $BL_2$ exists on the light shielding band SBr.

Figure 6C:
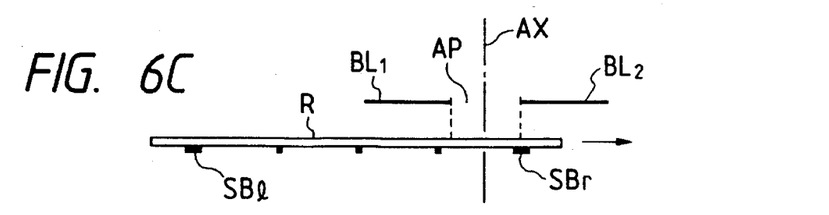

Then, the scan of the reticle R proceeds, and the edge $E_2$ of the blade $BL_2$ reaches, as shown in FIG. 6C, a position to determine the maximum opening width of the aperture AP. Thereafter, the movement of the blade $BL_2$ is halted. The driving system 22 for the blind mechanism 20 therefore incorporates a tacho-generator and an encoder for monitoring both a moving quantity and a moving velocity of each blade. Pieces of positional and velocity information given therefrom are transmitted to the main control unit 100 and employed for the synchronization with the scanning motion of the reticle stage 30.

Figure 6D:
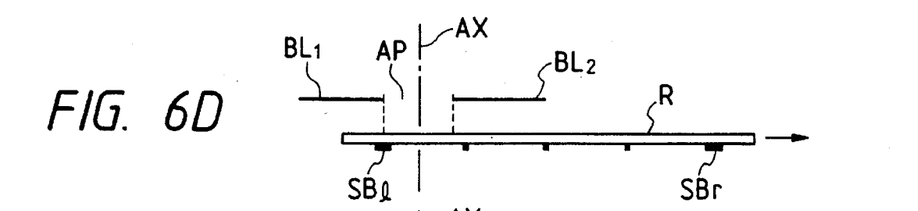
Figure 6E:
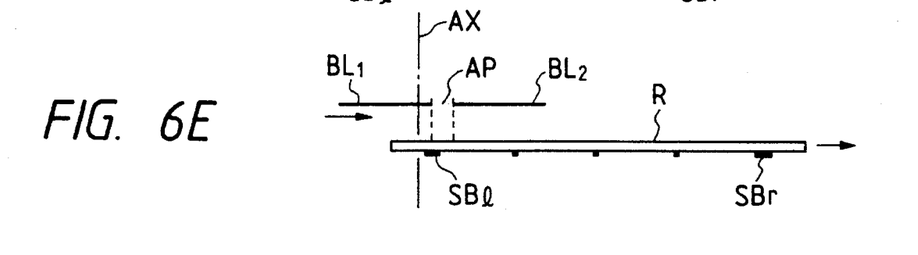

Thus, the reticle R is sent in the X-direction at a constant velocity up to a position shown in FIG. 6D while being irradiated with the illumination light passing through the aperture AP having the maximum width. That is, the image of the edge $E_1$ of the blade $BL_1$ located in the direction opposite to the advancing direction of the reticle R is, as depicted in FIG. 6E, run in the same direction in synchronization with the moving velocity from the time when the image of the edge $E_1$ of the blade $BL_1$ reaches the light shielding band SBl on the left side of the shot region of the reticle R.

Then, when the left light shielding band SBl is intercepted by the edge image of the right blade $BL_2$ (at this moment, the left blade $BL_1$ also comes, and the width Dap of the aperture AP becomes the minimum value DAmin), the movements of the reticle stage 30 and the blade $BL_1$ are stopped.

With the actions described above, the exposure (for one shot) by one-scan of the reticle comes to an end, and the shutter is closed. However, if the width Dap of the aperture AP is well smaller than the width Dsb of the light shielding band SB1 (or SBr) in that position, and when the illumination light leaking to the wafer W can be made zero, the shutter 6 may remain opened.

Next, the XY stage 48 is stepped in the Y-direction by one row of the shot regions. Scanning on the XY stage 48 and the reticle stage 30 is effected in a direction reverse to the direction set so far. The same scan-exposure is performed on a different shot region on the wafer W.

As discussed above, in accordance with this embodiment, the scan-directional stroke of the reticle stage 30 can be minimized. Besides, there is such an advantage that the light shielding bands SBl, SBr for defining the both sides of the shot region with respect to the scan direction may be small in terms of their widths Dsb.

Note that an unevenness in the exposure quantity in the scan direction is caused on the wafer W till the reticle stage 30 is accelerated from the state shown in FIG. 6A enough to reach a constant velocity scan.

For this reason, it is required that a prescan (prerunning) range be determined at the start of scanning till the state of FIG. 6A is obtained. In this case, it follows that the widths Dsb of the light shielding bands SBr, SBl are expanded correspondingly to a length of the prescan. This is similarly applied to a case where an overscan is needed corresponding to the fact that the constant velocity motion of the reticle stage 30 (XY stage 48) can not be abruptly stopped when finishing one scan-exposure.

Also in the case of performing the prescan and the overscan, however, the shutter 6 is set at a high speed. If an open response time (needed for bringing the shutter from a full closing state to a full opening state) and a close response time are considerably short, and just when the reticle stage 30 enters a main scan (position in FIG. 6A) after a completion of the prescan (acceleration) or shifting from the main scan to an overrun (deceleration), the shutter may be opened and closed interlocking therewith.

A response time $t_s$ of the shutter 6 may satisfy the following relationship under a condition such as Dsb> DAmin:

$$(Dsb-DAmin)/Vrs > t_s$$

where Vrs (mm/sec) is the constant scan velocity during the main scan on, e.g., the reticle stage 30, Dsb (mm) is the width of each of the light shielding bands SBl, SBr, and DAmin (mm) is the minimum width of the aperture AP on the reticle R.

Further, according to the apparatus in this embodiment, the yawing quantities of the reticle stage 30 and of the XY stage 48 are measured independently by the laser interferometers 38, 50, respectively. A difference between the two yawing quantities is obtained by the main control unit 100. A trace amount of rotation of the reticle stage 30 or the wafer holder 44 may be caused during the scan-exposure so that the difference therebetween becomes zero. In this instance, however, it is necessary that a center of the microscopic rotation be always identical with the center of the aperture AP. Taking a structure of the apparatus into consideration, it is possible to readily actualize a method of causing the microscopic rotation of an X-directional guide portion of the reticle stage 30 about an optical axis AX.

Figure 7:
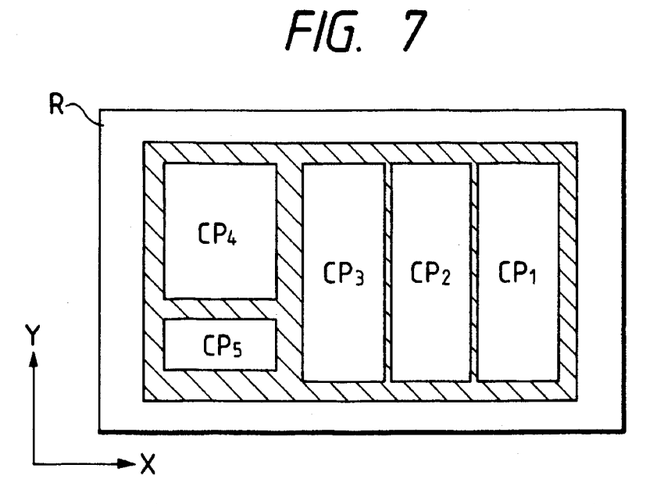
FIG. 7 is a plan view illustrating another pattern layout of the reticle mountable on the apparatus of FIG. 3.

FIG. 7 shows an example of another pattern layout of the reticle R mountable on the apparatus depicted in FIG. 3. The chip patterns $CP_1$, $CP_2$, $CP_3$ are employed for exposing the wafer by a step-and-scan (S & S) method using the illumination light coming from the slit aperture AP as in the case of the reticle R shown in FIG. 5. Further, other chip patterns $CP_4$, $CP_5$ formed on the same reticle R are employed for exposing the wafer by a step-and-repeat (S & R) method. This kind of proper use can be easily attained by setting the aperture AP with the aid of the blades $BL_1$–$BL_4$ of the blind mechanism 20. When exposing, e.g., the chip pattern $CP_4$, the reticle stage 30 is moved and set so that a center of the chip pattern $CP_4$ coincides with the optical axis AX. At the same time, the shape of the aperture AP may simply be matched with an external shape of the chip pattern $CP_4$. Then, only the XY stage 48 may be moved in a stepping mode. As discussed above, if the reticle pattern is set as shown in FIG. 7, the S & S exposure and the S & R exposure can be executed selectively by the same apparatus and, besides, done without replacing the reticle.

Figure 8:
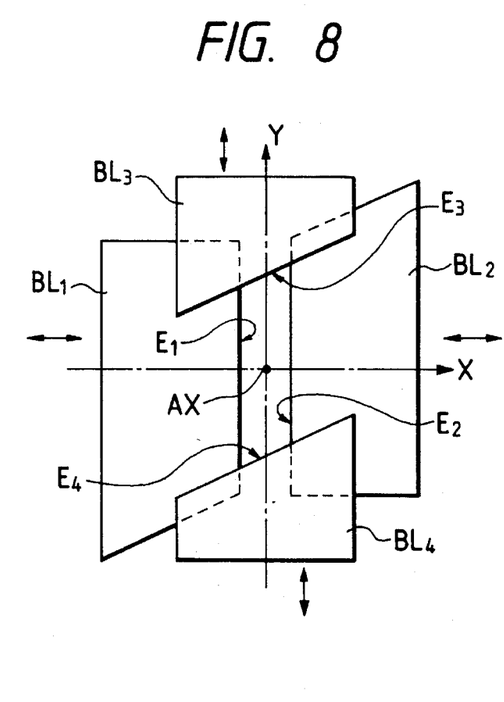
FIG. 8 is a plan view illustrating shapes of the blades of the blind mechanism in a second embodiment.

FIG. 8 illustrates one example of configurations of the blades $BL_1$–$BL_4$ of the blind mechanism 20 that correspond to a case where a size of the on-the-reticle chip pattern to be exposed in the (Y-) direction orthogonal to the scan direction increases with respect to the image field IF of the projection optical system. The edges $E_1$, $E_2$ for defining the scan-directional (X-directional) width of the aperture AP, as in the same way in FIG. 4 given above, extend in parallel in the Y-direction. The edges $E_3$, $E_4$ for determining the longitudinal direction of the aperture AP are parallel to each other but inclined to the X-axis. The aperture AP assumes a parallelogram. In this case, four pieces of blades $BL_1$–$BL_4$ move in the X- and Y-directions in interlock with the movement of the reticle during the scan exposure. An X-directional moving velocity Vbx of an image of each of the edges $E_1$, $E_2$ of the blades $BL_1$, $BL_2$ in the scan-exposure direction is, however, substantially the same as the scan velocity Vrs of the reticle. If there exists a necessity for moving the blades $BL_3$, $BL_4$, a Y-directional moving velocity Vby of each of the edges $E_3$, $E_4$ is required to synchronize with a relationship such as Vby=Vbx·tan θe, where θe is the inclined angle of each of the edges $E_3$, $E_4$ with respect to the X-axis.

FIGS. 9A–9F schematically illustrate a scan sequence during the S & S exposure in the case of an aperture shape shown in FIG. 8. Throughout FIGS. 9A–9F, it is assumed that the aperture AP is projected on the reticle R and defined by the respective edges $E_1$–$E_4$ thereof. In accordance with a second embodiment shown in FIGS. 8 and 9A–9F, a chip pattern region CP on the reticle R which is to be projected on the wafer W has, it is also presumed, a size that is approximately twice the longitudinal dimension of the aperture AP. The second embodiment therefore takes such a structure that the reticle stage 30 is stepped precisely in the Y-direction orthogonal to the scan direction.

Figure 9A:
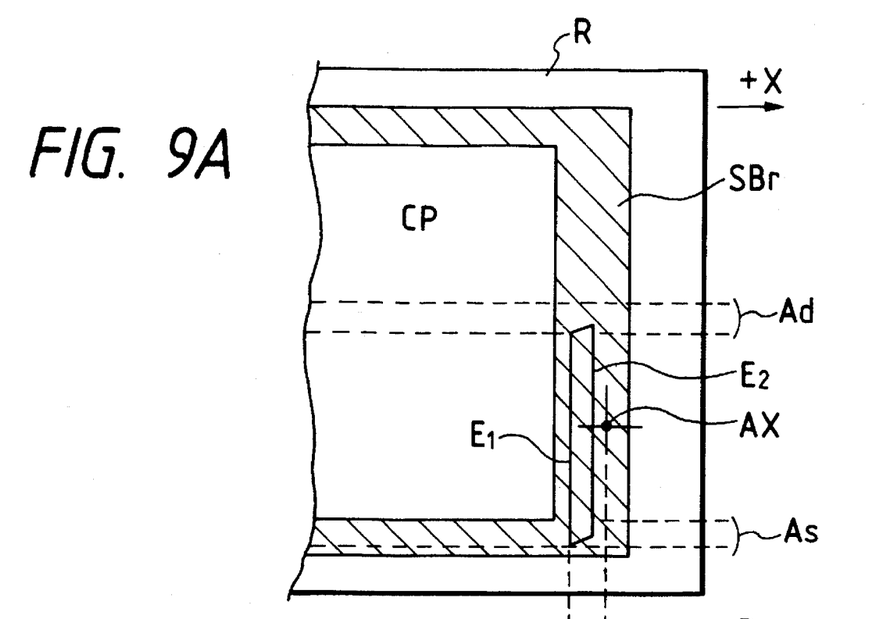
FIGS. 9A–9F are explanatory views showing a sequence of a step & scan exposure in the second embodiment.

At the first onset, the blades $BL_1$, $BL_2$ shown in FIG. 8 are adjusted and set as illustrated in FIG. 9A at the start of scanning.

More specifically, the aperture AP having a width narrowed most is positioned on the light shielding band SBr on the right side of the reticle R. Simultaneously, the left edge $E_1$ of the aperture AP is set in a position (edge position in which the aperture AP is expanded most in the X-direction) spaced most away from the optical axis AX. Further, throughout FIGS. 9A–9F, the exposure quantity for one scan-exposure lacks in subregions Ad, and As each extending beltwise in the scan direction (X-direction). These subregions Ad, As are formed because of the fact that the upper and lower edges $E_3$, $E_4$ of the aperture AP are inclined to the X-axis. A Y-directional width of each of the subregions Ad, As is univocally determined such as DAmax·tan θe, where θe is the inclined angle of each of the edges $E_3$, $E_4$, and DAmax is the maximum aperture width defined by the edges $E_1$, $E_2$. The scan-exposure is conducted while overlapping triangular areas shaped by the edges $E_3$, $E_4$ of the aperture AP in the Y-direction with respect to the subregion Ad of the subregions Ad, As with this unevenness in terms of the exposure quantity that are set in the pattern region CP. An attempt to make the exposure quantity uniform is thus made. Further, in connection with the other subregion As, this subregion is matched exactly with the light shielding band on the reticle R.

Figure 9B:
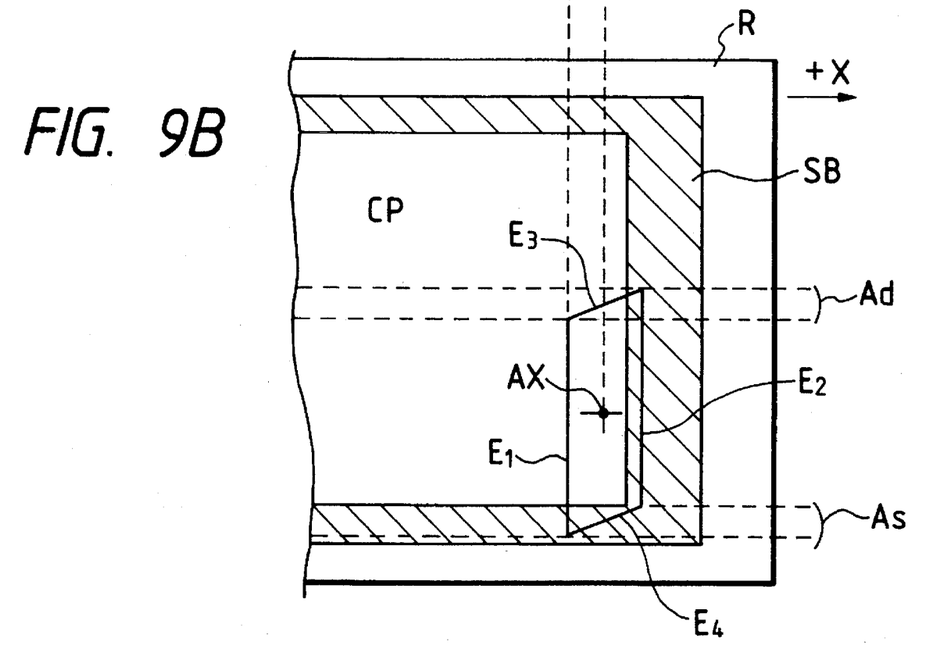

Now, the reticle R and the edge $E_2$ (blade $BL_2$) are made run substantially at the same velocity in a +X-direction (right in the same Figure) from the state shown in FIG. 9A. Eventually, as depicted in FIG. 9B, the X-directional width of the aperture AP is maximized, and the movement of the edge $E_2$ is also halted. In this state shown in FIG. 9B, the center of the aperture AP substantially coincides with the optical axis AX.

Figure 9C:
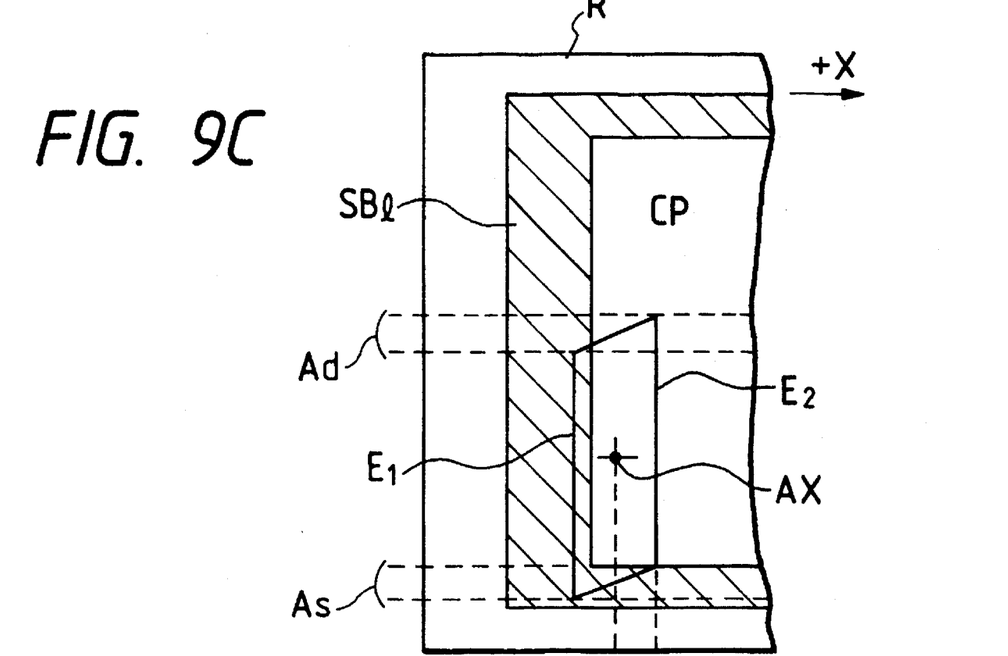
Figure 9D:
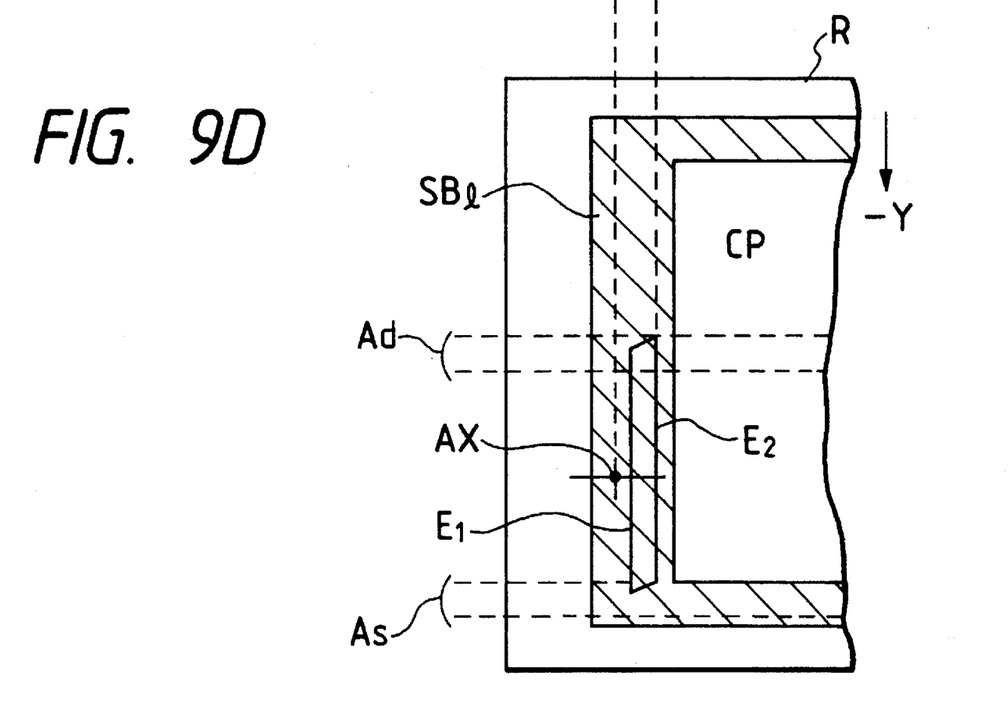

Thereafter, only the reticle R moves at the constant velocity in the +X-direction. As illustrated in FIG. 9C, the edge $E_1$ (blade $BL_1$) and the reticle R move rightward (in the +X-direction) substantially at the same velocity from the time when the left edge $E_1$ of the aperture AP enters the left light shielding band SB1. Approximately a lower half of the chip pattern region CP is thus exposed. The reticle R and the aperture AP are stopped in a state shown in FIG. 9D.

Figure 9E:
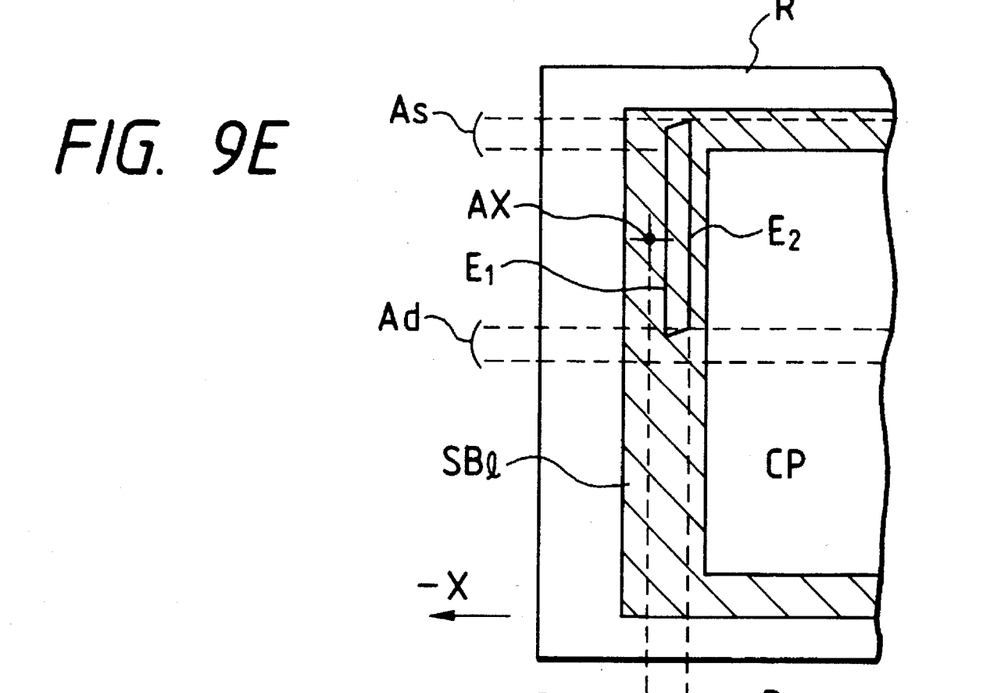

Next, the reticle R is stepped precisely by a fixed quantity in a −Y-direction. The wafer W is similarly stepped in a +Y-direction. Then, a state shown in FIG. 9E is developed. At this time, a relative positional relationship in the Y-direction is so set that the overlapped subregion Ad undergoes an overlap exposure at the triangular area defined by the edge $E_4$. Additionally, on this occasion, if it is required that the Y-directional length of the aperture AP be varied, a movement of the edge $E_3$ (blade $BL_3$) or $E_4$ (blade $BL_4$) is controlled in the Y-direction.

Figure 9F:
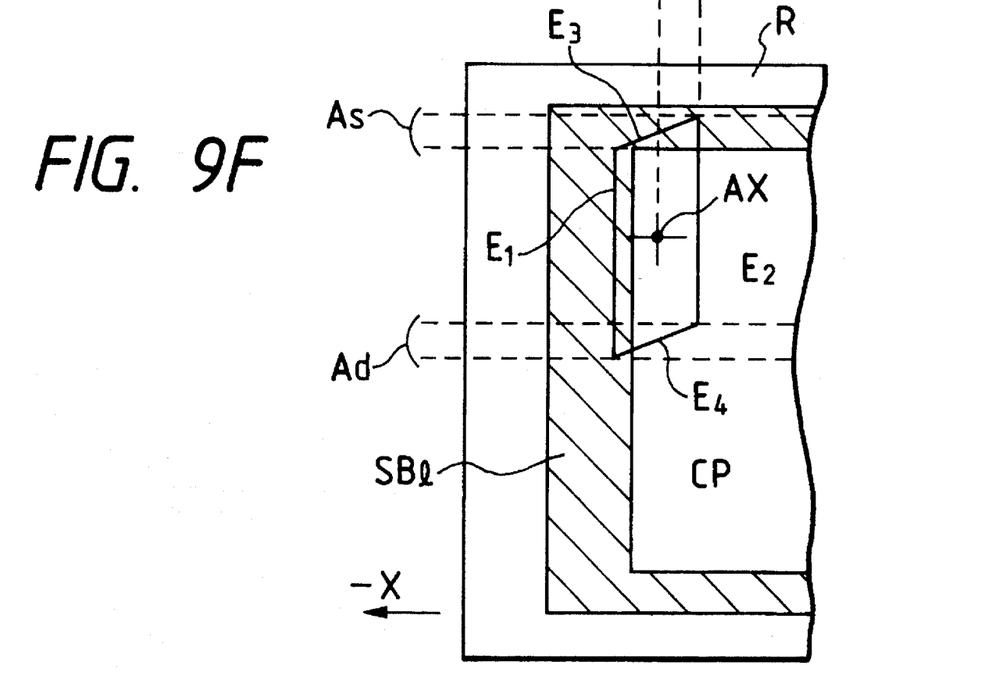

Next, the reticle R is scan-moved in a −X-direction, and simultaneously the edge $E_1$ (blade $BL_1$) is moved in the −X-direction in interlock therewith. Then, as shown in FIG. 9F, when the aperture width defined by the edges $E_1$, $E_2$ comes to the maximum, the movement of the edge $E_1$ is stopped. Only the reticle R continuously moves at the constant velocity in the −X-direction.

With the actions described above, it is possible to expose, on the wafer W, the chip pattern region CP equal to or larger than the Y-directional dimension of the image field of the projection optical system. Besides, the overlapped subregion Ad is set. The two edge subregions (triangular areas) undergo the overlap exposure by two scan-exposing processes, wherein the exposure quantity lacks depending on the shape of the aperture AP by one scan-exposing process. The exposure quantity within the subregion Ad is also made uniform (seamless).

Figure 10:
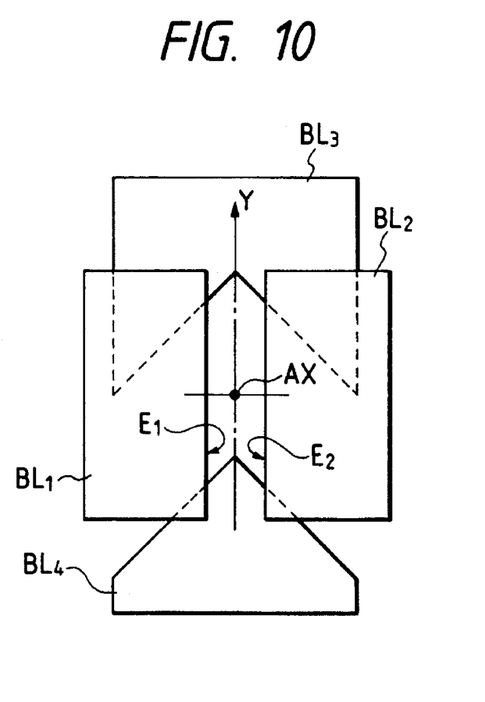
FIG. 10 is a plan view illustrating other shapes of the blades.

FIG. 10 sketches other blade configurations of the blind mechanism 20. The edges $E_1$, $E_2$ of the blades $BL_1$, $BL_2$ which determine the scan direction are conceived as straight lines parallel to each other. The edges of the blades $BL_3$, $BL_4$ extending in the direction orthogonal to the scan-direction take triangles that are symmetric with respect to the Y-axis passing through the optical axis AX. Then, the edges of the blades $BL_3$, $BL_4$ herein assume, when approaching each other in the Y-direction, complementary shapes capable of substantially completely intercepting the light. Accordingly, the aperture AP may take a so-called chevron shape. In the case of such a chevron shape also, the uniformness can be similarly attained by executing the overlap exposure on the triangular areas at both ends.

Figure 11:
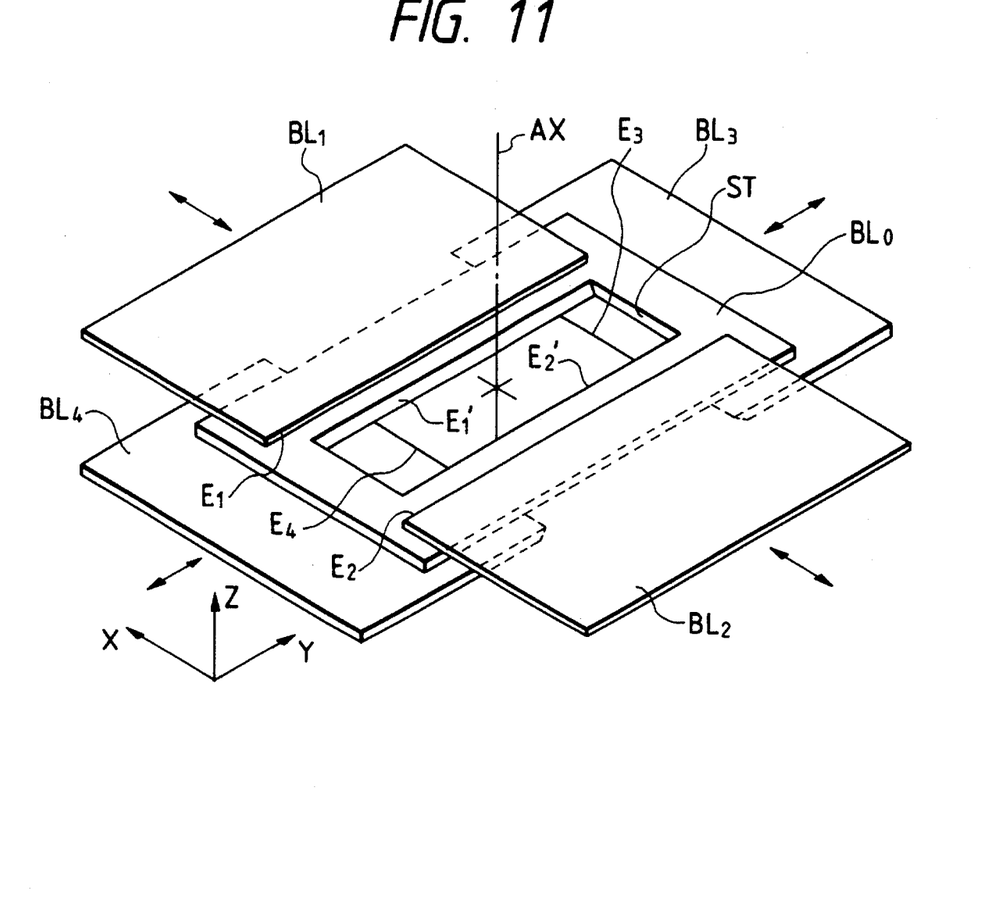
FIG. 11 is a perspective view illustrating a structure of the blind mechanism in a third embodiment.

Next, the blade configurations and the operation in accordance with a third embodiment of this invention will be explained with reference to FIGS. 11 and 12. Provided herein, as shown in FIG. 11, is a fixed blade $BL_0$ formed with a rectangular aperture ST having a fixed width in the scan-exposure direction (X-direction). The rectangular aperture ST includes two parallel edges $E_1'$, $E_2'$ for defining its X-directional width. The rectangular aperture ST is formed as a rectangle elongated in the Y-direction on the whole. The illumination region in the longitudinal direction is defined by the respective edges $E_3$, $E_4$ of the blades $BL_3$, $BL_4$ disposed on the lower surface of the fixed blade $BL_0$ and one-dimensionally moving in the Y-direction. Hence, the aperture AP is defined by the four edges $E_1'$, $E_2'$, $E_3$, $E_4$.

Disposed further on the upper surface of the fixed blade $BL_0$ are the blades $BL_1$, $BL_2$ moving in the X-direction in interlock (synchronization) therewith at the start or end of movement of the reticle R. In accordance with this embodiment the edges $E_1$, $E_2$ of the blades $BL_1$, $BL_2$ do not, unlike each of the preceding embodiments, serve as those for defining a range where an interior of the chip pattern region of the reticle R is illuminated during the scan-exposure. These edges $E_1$, $E_2$ function simply as a shutter. Therefore, the blades $BL_1$, $BL_2$ may be constructed to move at a high velocity with a more reduction in weight than that of other blades $BL_3$, $BL_4$.

Figure 12:
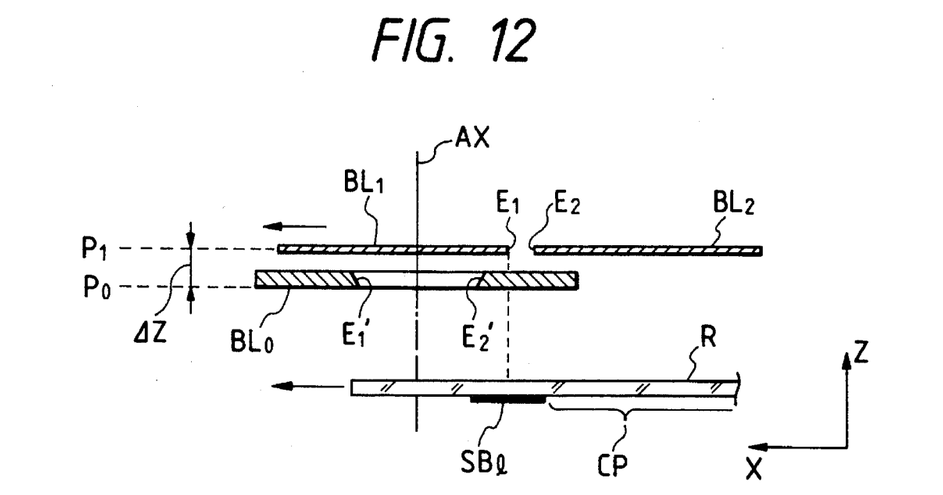
FIG. 12 is an explanatory view showing how the blind mechanism operates.

FIG. 12 schematically showing a relationship of the reticle R versus the blades $BL_1$, $BL_2$ and the fixed blade $BL_0$ that are shown in X-Z section. It is herein assumed that the reticle R moves from left to right, and the scan-exposure is then effected. Further, in this embodiment, the edges $E_1'$, $E_2'$ of the fixed blade $BL_0$ and the respective edges $E_3$, $E_4$ of the blades $BL_3$, $BL_4$ are located on a plane $P_0$ conjugate to the pattern surface of the reticle R. The blades $BL_1$, $BL_2$ serving as a shutter are, it is presumed, located on a plane $P_1$ spaced by $\Delta Z$ away from the plane $P_0$ in the direction of the optical axis AX.

Now, the edge $E_1$ of the left blade $BL_1$ is, as shown in FIG. 12, located more rightward than the edge $E_2'$ of the fixed blade $BL_0$ to completely shields the aperture AP from the light till the left light shielding band SB1 on the reticle R reaches the right edge $E_2'$ partly configuring the aperture AP since the scan of the reticle R (wafer W) has been started. Then, a portion in the vicinity of the X-directional mid-point of the light shielding band SB1 reaches a position corresponding to the edge $E_1$ of the blade $BL_1$. Hereafter, the blade $BL_1$ moves leftward at a velocity corresponding to the moving velocity of the reticle R so that the edge $E_1$ follows up the light shielding band SB1. The edge $E_1$ of the blade $BL_1$ is thus located more leftward by a given quantity than the left edge $E_1'$ of the fixed blade $BL_0$ (the aperture AP is fully opened). Just at this moment, the movement of the blade $BL_1$ is halted. At the end of the scan-exposure, the right blade $BL_2$ moves so that the edge $E_2$ of the blade $BL_2$ tracks the light shielding band SBr on the right side of the reticle R. Eventually, the blade $BL_2$ completely shield the aperture AP from the light.

In accordance with the embodiments discussed above, the edges $E_1$, $E_2$ of the blades $BL_1$, $BL_2$ functioning as the shutter are always projected in a defocus state on the light shielding band SB1 or SBr but not projected within the chip pattern region at all.

By the way, when effecting the scan-exposure by means of a pulse light source such as an excimer laser, etc., it follows that a pulse light emission takes place every time the reticle R (wafer W) moves a given distance (a value well smaller than the X-directional width of the aperture AP). In this instance, it is desirable that the projection image, on the reticle R, of the edges $E_1'$, $E_2'$ of the aperture AP which define the scan-directional width would rather lack in sharpness. Namely, it may be preferable that the edges $E_1'$, $E_2'$ deviate from the plane $P_0$.

On the other hand, the edges $E_1$, $E_2$ of the blades $BL_1$, $BL_2$ functioning as the shutter give an unnecessary light quantity to the exteriors of the light shielding bands, depending on the defocus quantity thereof, if the scan-directional width of each of the light shielding bands SB1, SBr is small. It is therefore desirable that the edges $E_1$, $E_2$ of the blades $BL_1$, $BL_2$ would rather be projected on the reticle R as a sharp image. Thereupon, paying attention to FIG. 12, the plane $P_1$ may be conjugate to the pattern surface of the reticle R, while the plane $P_0$ may be shifted to a defocus position.

It is apparent that, in this invention, a wide range of different working modes can be formed based on the invention without deviating from the spirit and scope of the invention. This invention is not restricted by its specific working modes except being limited by the appended claims.

What is claimed is:

1. In a projection exposure apparatus for projecting patterns of a mask on a photosensitive substrate by a scan-exposure method, said apparatus comprising:

a projection optical system for projecting said patterns on an exposed region of said photosensitive substrate, said patterns being formed within a transfer region on said mask;

a mask stage for making one-dimensional movements over a range equal to or larger than a one-directional width dimension of said mask transfer region in a state where said mask is held substantially perpendicular to an optical axis of said projection optical system; and a substrate stage for one-dimensionally moving said photosensitive substrate at a velocity synchronizing with a moving velocity of said mask stage in said one-dimensional moving direction of said mask stage, the improvement comprising:

an illuminating means for illuminating said mask transfer region with illumination light for an exposure through an aperture of a variable field stop disposed in a position substantially conjugate to said mask;

a driving means for configuring said aperture of said variable field stop in a rectangular shape having edges substantially orthogonal to a direction of said scan-exposure and simultaneously making variable a width of said rectangular shape in said scan-exposure direction; and a control means for controlling said driving means to change a width of said rectangular aperture of said variable field stop in interlock with variations in position of said variable field stop on said mask transfer region which varies due to the one-dimensional movements of said mask stage.

2. The projection exposure apparatus of claim 1, wherein said control means controls said driving means to sequentially reduce the width of said rectangular aperture of said variable field stop in a direction of said one-dimensional movement in synchronization with a shift of a peripheral portion of said mask transfer region toward a portion in the vicinity of the optical axis of said projection optical system.

3. The projection exposure apparatus of claim 1, wherein the shape of said aperture of said variable field stop is made variable two-dimensionally from a maximum open state including substantially the whole of said mask transfer region to a full closing state to intercept substantially the illumination light falling on said mask, and, when said aperture of said variable field stop is set in said maximum open state, said substrate undergoes a static exposure by inhibiting a reticle scan between said mask stage and said substrate stage.

4. A projection exposure apparatus comprising:

a projection optical system for projecting a pattern formed on a mask onto a photosensitive substrate;

a device for moving said mask and said photosensitive substrate in a direction substantially perpendicular to an optical axis of said projection optical system in order to transfer said pattern onto said photosensitive substrate;

an illumination system for illuminating said mask with illumination light through an opening of a field stop disposed on or away from a plane which is conjugate with said mask; and an optical device for, in association with change in position of an illuminated region on said mask following movement of the mask, changing a width of said mask in a moving direction of said mask.

5. An apparatus according to claim 4, wherein said optical device includes a light interrupting member by which a width of an opening through which an illumination light directed to said mask passes is changed.

6. An apparatus according to claim 5, wherein said light interrupting member includes a plurality of movable blades forming said opening and being disposed on a plane which is substantially conjugate with said mask or a plane which is away from the conjugate plane by a predetermined distance.

7. An apparatus according to claim 5, wherein said optical device includes a member for driving said plurality of movable blades so that the width of the opening of said light interrupting member may change from zero to more than the width of the opening of said field stop.

8. An apparatus according to claim 5, wherein said light interrupting member is positioned at a plane which is substantially conjugate with said mask, and said field stop is positioned away from said light interrupting member by a predetermined distance.

9. An apparatus according to claim 4, wherein said projection optical system has a circular image field, and said field stop has a rectangular aperture for forming an image of said pattern in a rectangular region in which an optical axis of said projection optical system in said circular image field is contained.

10. An apparatus according to claim 4, wherein said moving device includes a mask stage which is movable in a direction substantially perpendicular to the optical axis of said projection optical system while holding said mask, a substrate stage for holding said photosensitive substrate and movable in a direction substantially perpendicular to the optical axis of said projection optical system while holding said photosensitive substrate and a drive device for synchronously driving said mask stage and said substrate stage at a speed ratio corresponding to a magnification of said projection optical system.

11. A projection exposure apparatus for exposing a pattern formed on a mask onto a photosensitive substrate, comprising:

a light source;

an optical integrator on which a light beam from the light source is incident and which forms a plurality of images of the light source;

a first shutter disposed between said light source and said optical integrator;

a collecting optical system for collecting light beams from the plurality of the light source images to illuminate the mask;

a field stop disposed between said optical integrator and said collecting optical system and having a slit-shaped opening;

a second shutter disposed between said optical integrator and said mask;

a projection optical system for projecting the pattern formed on the mask onto the photosensitive substrate; and a device for moving said mask and said photosensitive substrate in a direction substantially perpendicular to an optical axis of said projection optical system.

12. An apparatus according to claim 11, wherein said second shutter includes a light interrupting member having a variable opening through which light directed to said mask passes.

13. An apparatus according to claim 12, wherein said light interrupting member includes a plurality of movable blades for forming said opening.

14. An apparatus according to claim 12, further comprising:
   a drive member for changing the width of the opening of the light interrupting member to change a width of an illumination area in a moving direction of the mask in association with change in position of an illumination region which is defined by the opening of said field stop, the change in position following movement of the mask.

15. An apparatus according to claim 11, wherein said second shutter is disposed on a plane which is substantially conjugate with said mask or which is away from the conjugate plane by a predetermined distance.

16. An apparatus according to claim 15, wherein said second shutter is disposed on a plane which is substantially conjugate with said mask, and said field stop is disposed away from said second shutter by a predetermined distance.

17. An apparatus according to claim 11, wherein said projection optical system includes a circular image field, and said field stop has a rectangular opening for forming an image of said pattern in a rectangular region in which an optical axis of said projection optical system within said circular image field is contained.

18. An apparatus according to claim 11, wherein said moving device includes a mask stage which is movable in a direction substantially perpendicular to the optical axis of the projection optical system while holding said mask, a substrate stage which is movable in a direction substantially perpendicular to the optical axis of said projection optical system while holding said photosensitive substrate, and a drive device for synchronously driving said mask stage and said substrate stage at a speed ratio corresponding to a magnification of said projection optical system.

19. A projection exposure apparatus comprising:
   an illumination system for illuminating a mask with illumination light;
   a projection optical system for projecting a pattern formed on said mask onto a photosensitive substrate;
   a device for moving said mask and said photosensitive substrate in a direction substantially perpendicular to an optical axis of said projection optical system in order to transfer said pattern onto said photosensitive substrate; and
   an optical device for, in association with change in position of an illumination region on said mask following movement of said mask, changing a width of the illumination area in a moving direction of the mask.

* * * * *